(12) United States Patent
Hsu et al.

(10) Patent No.: US 6,555,874 B1
(45) Date of Patent: Apr. 29, 2003

(54) METHOD OF FABRICATING HIGH PERFORMANCE SIGE HETEROJUNCTION BIPOLAR TRANSISTOR BICMOS ON A SILICON-ON-INSULATOR SUBSTRATE

(75) Inventors: Sheng Teng Hsu, Camas, WA (US); Douglas James Tweet, Camas, WA (US); Bruce Dale Ulrich, Beaverton, OR (US); Hong Ying, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/649,380

(22) Filed: Aug. 28, 2000

(51) Int. Cl.[7] .......................................... H01L 31/0392
(52) U.S. Cl. ...................... 257/347; 257/349; 257/350; 257/351
(58) Field of Search ................................ 257/370, 347, 257/348, 350, 352

(56) References Cited

U.S. PATENT DOCUMENTS 5,430,318 A * 7/1995 Hsu ............................ 257/350
5,521,399 A * 5/1996 Chu et al. ..................... 257/36
5,583,059 A * 12/1996 Burghartz ............ 148/DIG. 10
5,889,293 A * 3/1999 Rutten et al. ................ 257/211
6,130,458 A * 10/2000 Takagi et al. ................ 257/341
6,180,442 B1 * 1/2001 Gris ............................ 438/202
6,232,649 B1 * 5/2001 Lee ............................. 257/588
6,235,567 B1 * 5/2001 Huang ........................ 438/202
6,245,604 B1 * 6/2001 Violette ...................... 438/202
6,246,094 B1 * 6/2001 Wong ......................... 257/397
6,218,060 B1 * 8/2001 Igarashi ..................... 438/202
6,284,581 B1 * 9/2001 Pan ............................ 438/202

FOREIGN PATENT DOCUMENTS

JP 406125044 A * 5/1994

* cited by examiner

Primary Examiner—Wael Fahmy
Assistant Examiner—Nathan W. Ha
(74) Attorney, Agent, or Firm—David C. Ripma; Matthew D. Rabdau; Scott C. Krieger

(57) ABSTRACT

A semiconductor structure includes, on a SOI substrate, a CMOS formed on the substrate; and a SiGe HBT formed on the substrate. A method of fabricating a semiconductor structure includes preparing a SOI substrate having plural active regions thereon; forming a CMOS on the SOI substrate in a first active region; and forming a SiGe HBT on the SOI substrate in another active region.

12 Claims, 8 Drawing Sheets

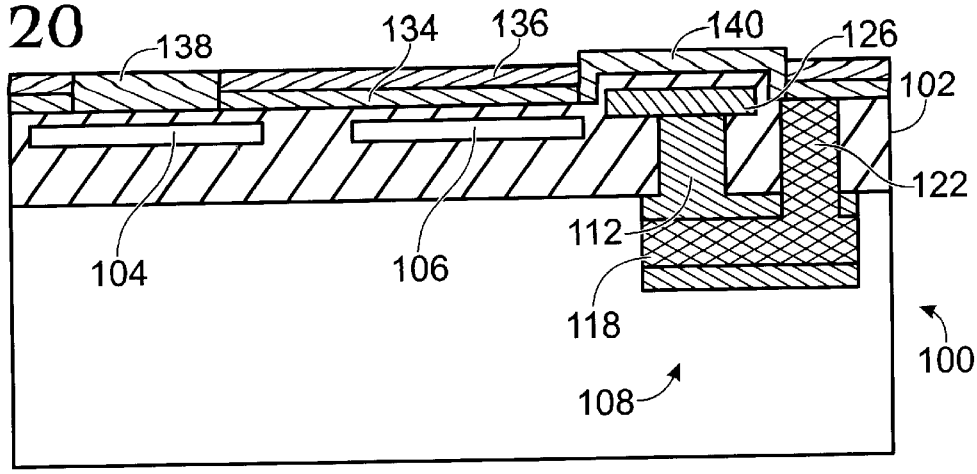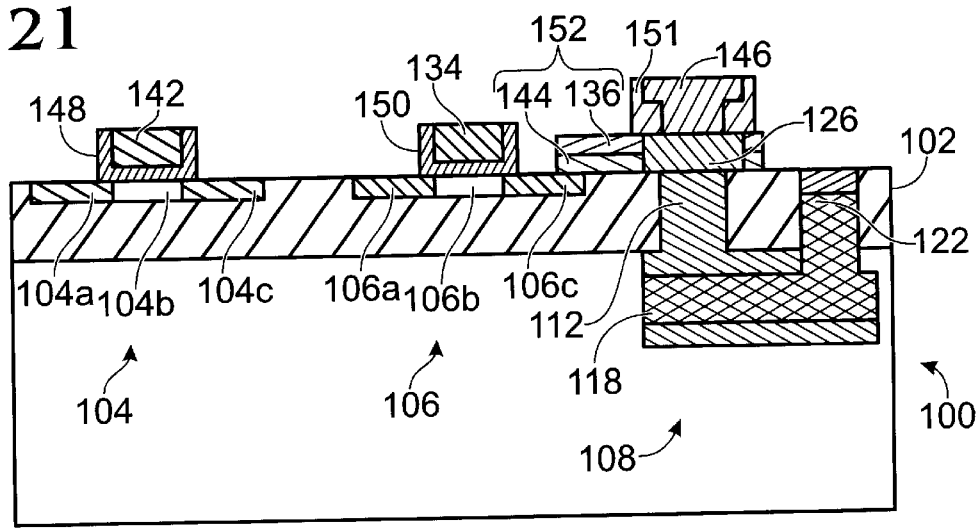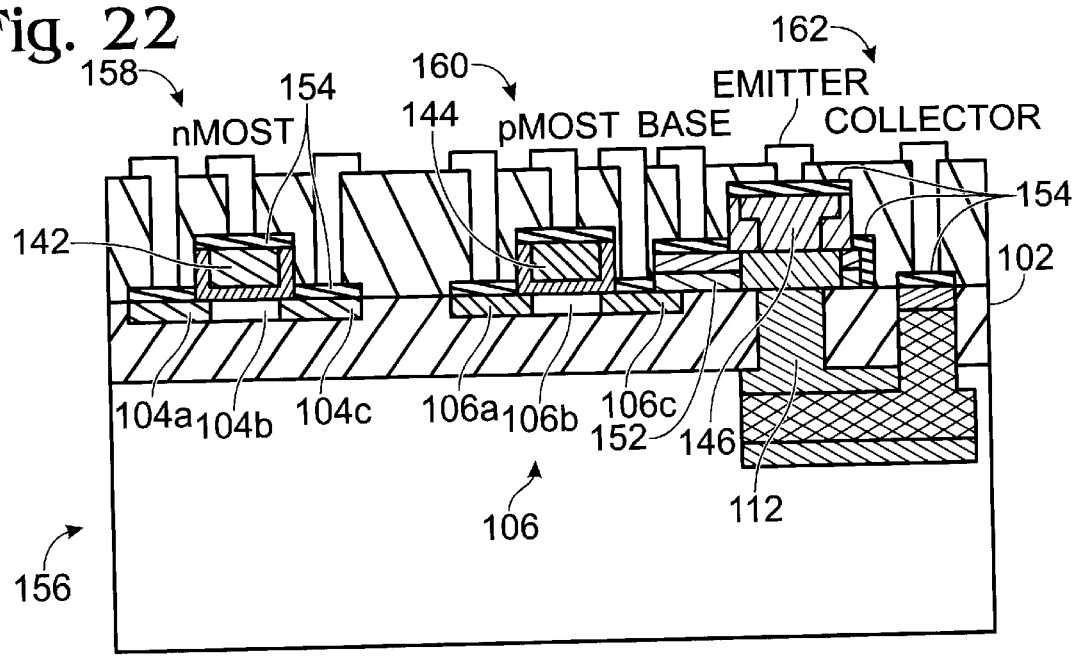

METHOD OF FABRICATING HIGH PERFORMANCE SIGE HETEROJUNCTION BIPOLAR TRANSISTOR BICMOS ON A SILICON-ON-INSULATOR SUBSTRATE

FIELD OF THE INVENTION

This invention relates to CMOS integrated circuit fabrication processes, and specifically to a process for forming a SiGe heterojunction bipolar transistor BiCMOS on a silicon-on-insulator substrate. Such a structure is particularly suited for use in high-speed, mixed-signal circuits.

BACKGROUND OF THE INVENTION

The prior art describes the construction of a of SiGe bipolar CMOS (BiCMOS) by fabricating a SiGe heterojunction bipolar transistor (HBT) and a CMOS on a bulk silicon substrate. This process produces a very high performance HBT, for analog signal processing, and a CMOS, for digital signal processing and data storage. A significant problem with such structure is that the bulk CMOS is relatively slow and requires a relatively high power input. The fabrication process is relatively complex, and the resulting product is not suitable for hand-held wireless devices, because of its power requirements. By integrating a SiGe HBT and CMOS onto a silicon-on-insulator (SOI) substrate, the performance of the SiGe HBT and the low power, high-speed properties of SOI CMOS devices may be achieved in a single structure. The SiGe HBT provides a high-speed front-end transceiver and the CMOS provides data processing and storage.

SUMMARY OF THE INVENTION

A semiconductor structure includes, on a SOI substrate, a CMIOS formed on the substrate; and a SiGe HBT formed on the substrate. A method of fabricating a semiconductor structure includes preparing a SOI substrate having plural active regions thereon; forming a CMOS on the SOI substrate in a first active region; and forming a SiGe HBT on the SOI substrate in another active region.

An object of the invention is to provide a inixed-signal processing structure which has relatively low power consumption.

Another object of the invention is to provide a high performance SiGe heterojunction bipolar transistor BiCMOS on a silicon-on-insulator substrate.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 10–22 depict steps in a second embodiment of the invention.

DETAILED DESCRIPTION OF THE PREFERRED EMBODIMENTS

The SiGe bipolar CMOS (BiCMOS) on a silicon-on-insulator (SOI) substrate of the invention has higher performance than does a SiGe BiCMOS formed on a bulk silicon substrate. This process retains the high performance of SiGe heterojunction bipolar transistor (HBT) and the low-power, high-speed properties of a CMOS formed on a SOI substrate. As will be explained, the fabrication process of SiGe BiCMOS on SOI is less complex than the fabrication process of SiGe BICMOS on a bulk silicon substrate.

Integration of a SiGe HBT and CMOS onto a SOI substrate takes advantage of the low-power, high-speed feature of SOI and the high-speed, high-power feature of SiGe HBT. The SiGe HBT is used as front-end receiver and transmitter (transceiver). This technology is suitable for hand-head terminals, such as TV remote control devices, wireless telephones, and other hand-held terminals in wireless communications applications.

The MOS transistor of the invention is completely isolated by oxide. The isolation of the MOS transistor reduces the parasitic capacitance found in convention structures. The CMOS may therefore be operated at higher frequencies than a CMOS fabricated on a bulk silicon substrate. The SiGe HBT is also isolated with oxide, except at the bottom of the buried collector. The extrinsic base of the HBT is made of a first polysilicon layer (poly 1) and the SiGe layers. The extrinsic base may be implanted with P+ ions at the same time as the pMOST source/drain ion implantation. The extrinsic base, the collector contact, and the emitter may be salicided at the same time as the CMOS. Increasing the thickness of the oxide beneath the first and second polysilicon layers reduces the collector-to-base and base-to-emitter parasitic capacitance. The parasitic resistance and the parasitic capacitance of the HBT can be very low, resulting in high performance of the HBT.

Figure 1:
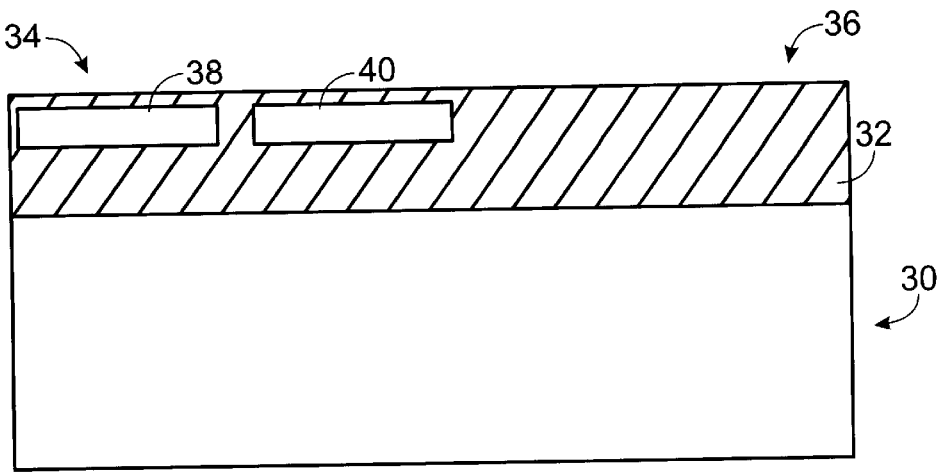
FIGS. 1–9 depicts steps in a first embodiment of the invention.

The fabrication process is as follows: Referring now to FIG. 1, the starting material is a standard SOI wafer, partially shown at 30, having a buried oxide thickness of about 400 $\mu$m, which is an industry standard for a buried oxide thickness in a separate by implantation of oxygen (SIMOX) wafer. The first step of the invention is the thinning of the top silicon film by a thermal oxidation process to a desired thickness. For 0.25 $\mu$m channel length process, the thickness of the top silicon is about 30 nm for a fully depleted SOI (FDSOI). For partially depleted SOI, the top silicon thickness for 0.25 $\mu$m CMOS is about 50 nm to 100 nm. Photoresist is applied for channel doping of the MOS transistors by ion implantation.

A local oxidation of silicon (LOCOS) process, or shallow trench isolation (STI) process, is performed to isolate the active MOS transistors. During this process step the top silicon on the HBT areas is also replaced with an oxide layer 32, as is shown in FIG. 1. In FIG. 1, STI is used to isolate active regions 34, 36, which will be used to form a CMOS and a SiGe HBT, respectively. This includes applying photoresist to the structure, and etching the top silicon from the isolation and HBT areas. The etch damage is cleaned and a layer of oxide is deposited onto the wafer. The oxide is chemical-mechanically polished (CMP) to obtain a flat surface. For bulk BiCMOS, the n-well and p-well must be formed prior to the STI process. The depth of STI for bulk BiCMOS has to be no shallower than 500 nm. Boron ions are implanted at a dose of between $5.0 \cdot 10^{12}$ cm$^{-2}$ and $5.0 \cdot 10^{13}$ cm$^{-2}$ and an energy of 30 Kev to 60 Kev to form p$^-$ wells 38, 40.

Figure 2:
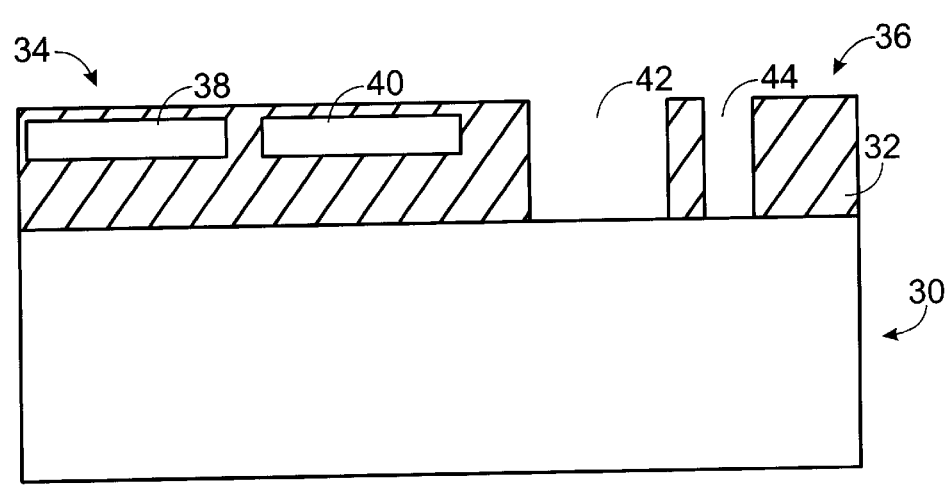

Photoresist is applied to etch the oxide on the HBT areas, including collector area 42 and substrate contact area 44. The resulting structure is depicted in FIG. 2.

Figure 3:
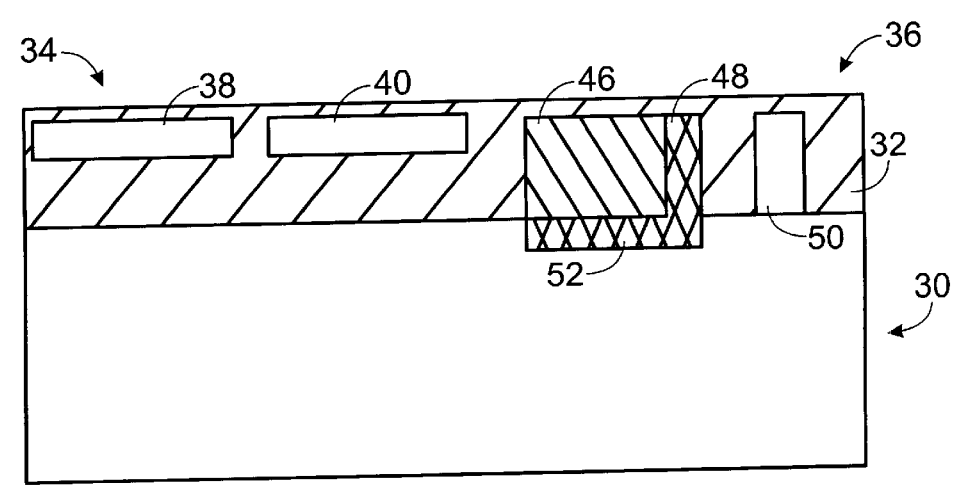

Referring now to FIG. 3, arsenic ions are implanted into silicon under collector 46 to form n+ buried collector 52. The ion dose is between about $1 \cdot 10^{14}$ cm$^{-2}$ to $1 \cdot 10^{15}$ cm$^{-2}$.

Silicon epitaxial layers 48, 50 are selectively grown on collector contact area 42 and substrate contact area 44, respectively, of the HBT. The silicon epitaxial layer has a thickness of between about 400 nm to 450 nm to completely fill the HBT trenches. The collector epitaxial may be grown with itisitu doping. The doping density of this layer will be $1 \cdot 10^{16}$ cm$^{-2}$ to $5 \cdot 10^{17}$ cm$^{-2}$. In this case a separate boron ion implantation to the substrate contact area is required. Phosphorus ions are implanted into collector area 42 by using a photoresist mask process. The energy is 15 keV to 25 keV and the dose is $1 \cdot 10^{12}$ cm$^{-2}$ to $5 \cdot 10^{13}$ cm$^{-2}$. Photoresist is removed and new mask applied for collector linker ion implantation. Multiple arsenic ion implantations maybe used to form a collector linker 48. The energies are 40 keV to 100 keV and 300 keV to 450 keV, respectively. The doses for both deep and shallow arsenic ion implantation are in the order of $1 \cdot 10^{14}$ cm$^{-2}$ to $1 \cdot 10^{15}$ cm$^{-2}$. A thin oxide of 20 nm to 100 nm is deposited and the implanted ions at the collector are diffused at high temperature (900° C. to 1100° C.) for 30 minutes to 100 minutes.

Figure 4:
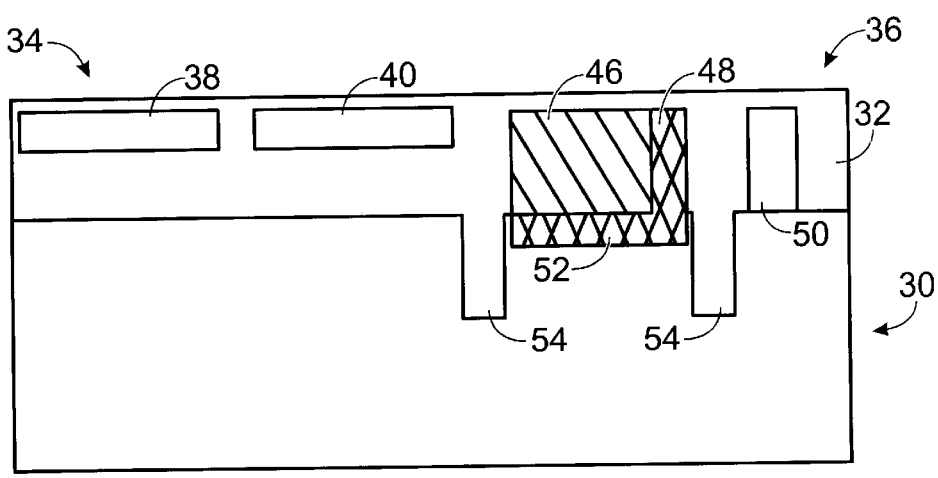

A deep trench 54 may be added to enhance the collector isolation during STI, as is shown in FIG. 4. The benefit of the deep trench, however, is relatively small and requires increased process complexity. Deep trench 54 is not shown in subsequent figures.

Figure 5:
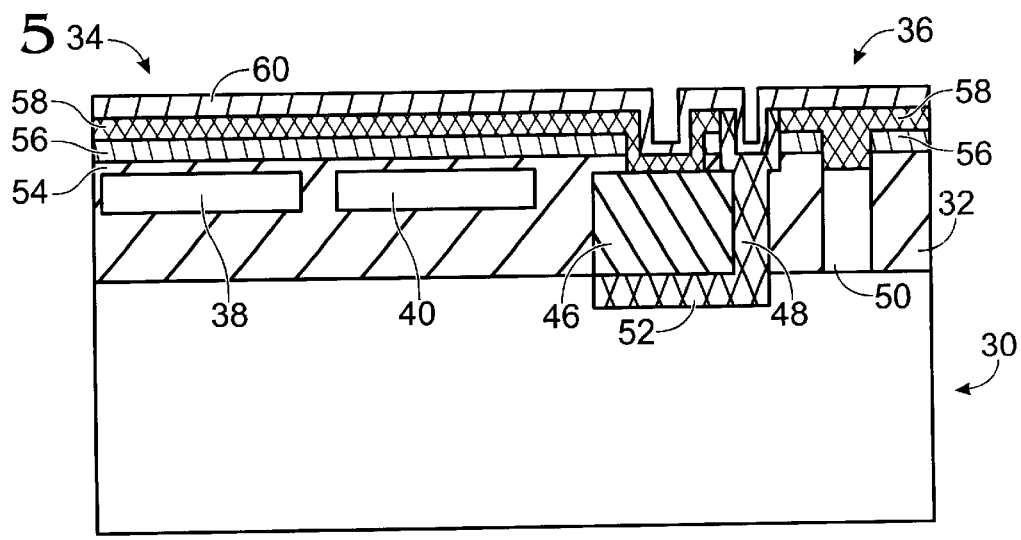

Referring to FIG. 5, photoresist is applied prior to the removal of the oxide on the CMOS areas. A gate oxide layer 54 is grown, and a thin first polysilicon layer 56 is deposited. The thickness of the polysilicon layer is between about 50 nm to 200 nm. Photoresist is applied to remove the polysilicon and the portions of oxide to open the base-to-collector contact, collector-linker contact, and substrate contact areas. Next, the germanium-doped silicon base layer 58 is grown with an oxide cap 60. The thickness of this SiGe layer is about 40 nm to 100 nm. It is preferred to have Ge concentration at the base/collector interface to be about 15% to 20%. The Ge concentration is monotonically decreased toward the top surface. At the top surface, i.e., the emitter-to-base interface, the Ge concentration is preferred to be no higher than 5%. However, in the case of very thin, i.e., less than 20 nm, SiGe layer, such as for very high frequency application, the Ge concentration may kept constant at 15% to 30%. Boron ions are implanted into the SiGe layer to form the base region of the bipolar transistor. The surface concentration of boron is on the order of $1 \cdot 10^{18}$ cm$^{-3}$. The density of boron exponentially decreases toward the base-collector junction. The SiGe base may also grown with an insitu boron doping process. An additional layer of photoresist is applied prior to implantation of the SiGe layer on the collector linker area N+.

Figure 6:
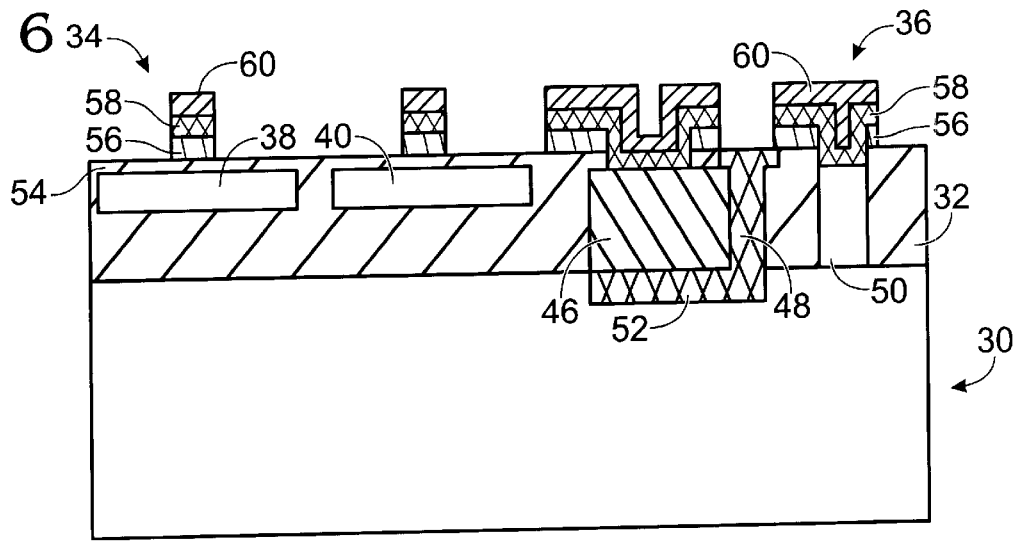

Referring to FIG. 6, photoresist is applied prior to etching of the SiGe and polysilicon layers for the formation of gate electrode. This is followed by PLDD and NLDD ion implantation. The ions for PLDD and NLDD are boron ions implanted at an energy level of between 10 Kev and 40 Kev, and phosphorous ion, implanted at an energy level of between 30 Kev and 110 Kev, respectively. Doses for both ions are between $1 \cdot 10^{12}$ cm$^{-2}$ to $5 \cdot 10^{13}$ cm$^{-2}$.

Figure 7:
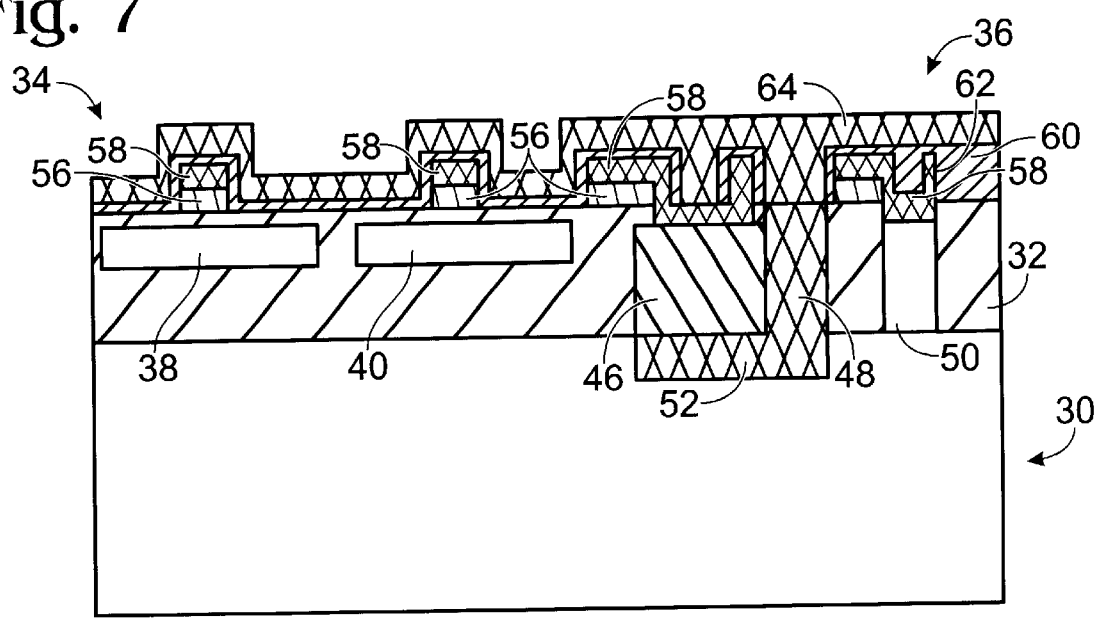

As shown in FIG. 7, a thin layer of oxide 62, having a thickness of between about 50 nm to 200 nm, is deposited. Photoresist is applied to open the emitter-base contact and the collector linker contact area. A second polysilicon layer (poly 2) 64 having a thickness of between about 100 nm to 300 nm, and a thin oxide cap, is deposited and is implanted and diffused N+ without any masking. This layer is referred to as an emitter polysilicon layer.

Figure 8:
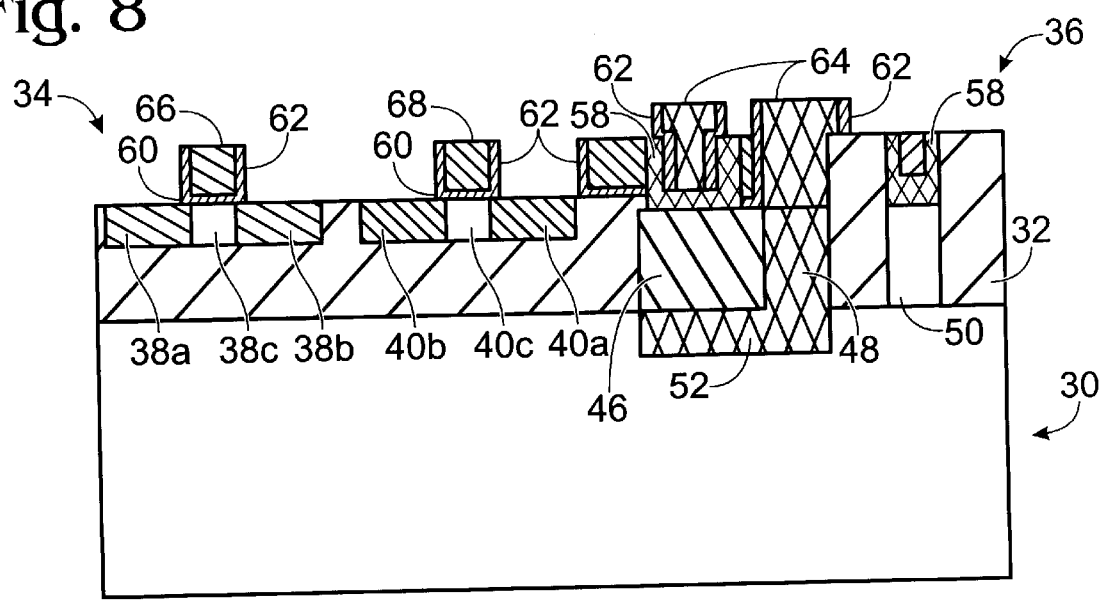

Turning now to FIG. 8, a photoresist mask is applied to etch emitter electrode. All portions of unmasked second polysilicon layer 64 are etched away, if the etching process is isotropic. If the etching process is anisotropic, some of second polysilicon layer 64 may remain at the sidewall of the gate electrode. After the photoresist in the emitter area is stripped, the oxide layer is anisotropically etched to form sidewall oxide. Photoresist is applied prior to implantation of N+ ions to form nMOST source 38a, drain 38b and collector contact area 38c. Another photoresist layer is deposited prior to implantation of P+ ions to form pMOST source 40a, drain 40b, extrinsic base and substrate contact areas 40c. Second polysilicon layer 64 is completely removed from the sidewall of the gate electrodes 66, 68 of MOS transistors, however, any remaining portion of second polysilicon layer 64 at the sidewall of the gate electrodes 66, 68 of MOS transistors will not adversely affect device properties.

Figure 9:
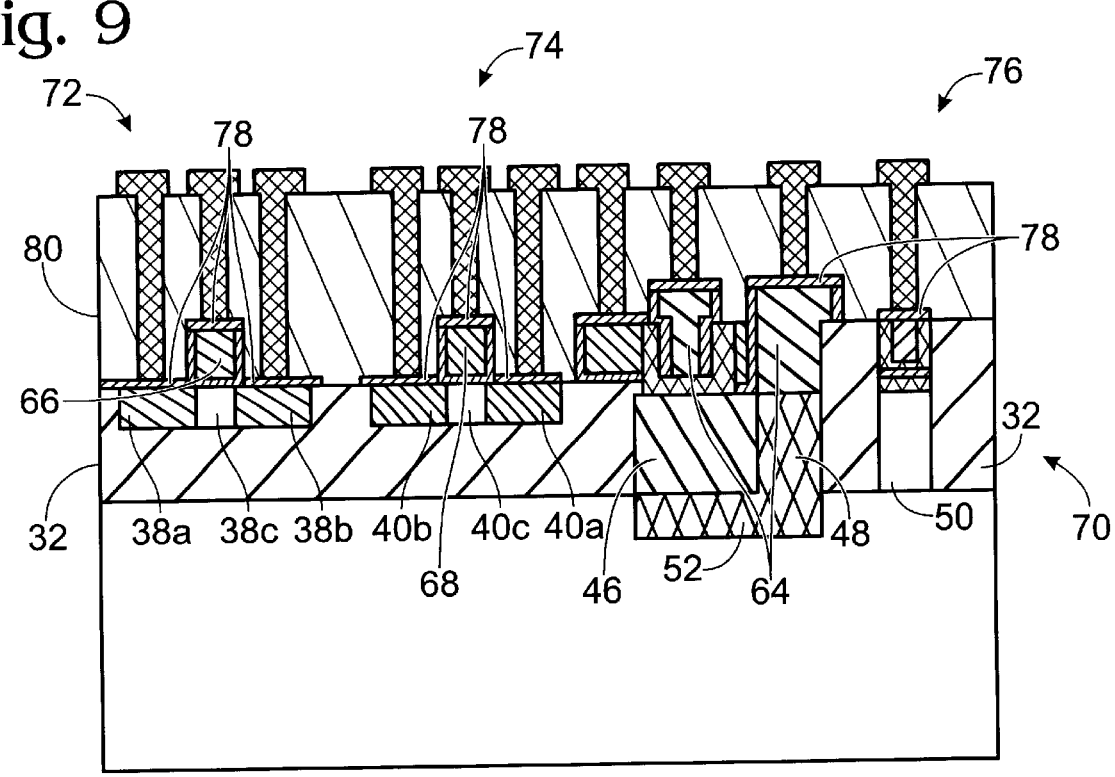

Following state-of-the-art salicidation, CVD oxide, photoresist contact etch, and metallization complete the wafer fabrication, the final SiGe BiCMOS on a SOI substrate structure 70 of the invention is depicted in FIG. 9. A silicide layer 78 is formed, an oxide layer 80 is deposited and the structure prepared for metallization, resulting in an nMOST 72, a pMOST 74 and an SiGe HBT 76.

Figure 10:
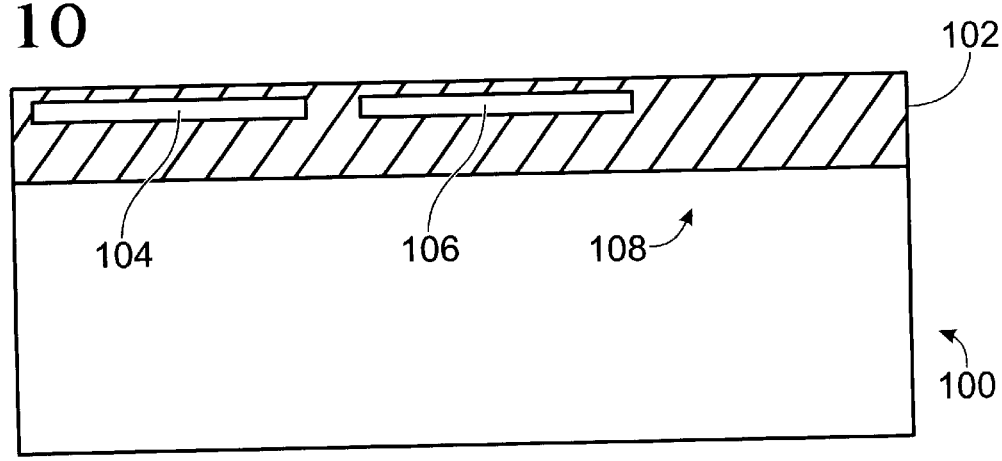

The fabrication process for a second embodiment of the invention begins with a thicker box, of between about 300 nm to 500 nm, on a SOI wafer. FIG. 10 depicts the starting stage of the invention, wherein a SOI wafer 100 is oxidized to thin the top silicon layer of SOI to a desired thickness of between about 10 nm to 200 nm. Device isolation may be performed by mesa, LOCOS, or shallow trench isolation, followed by CVD of an oxide layer 102 having a thickness of between about 10 nm to 50 nm. P-wells 104, which will become an nMOST active region, and n-well 106, which will become a pMOST active region, are formed. Another active region 108 is formed, which active region will become a SiGe HBT, resulting in the structure shown in FIG. 10.

Figure 11:
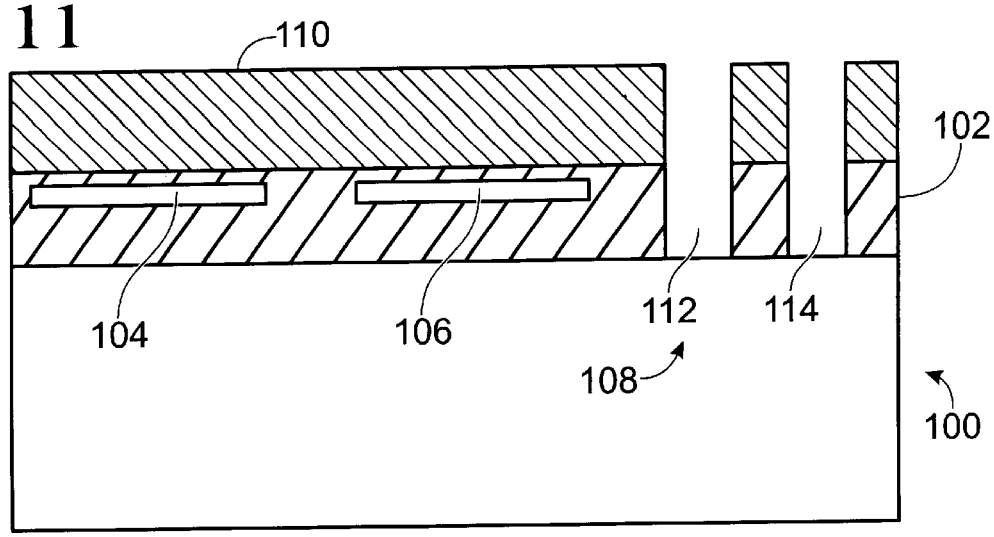

Referring to FIG. 11, photoresist 110 is applied, and the oxide layer on pMOST active region 106 and HBT active region base 112 and collector link region 114 is etched. The photoresist is then removed.

Figure 12:
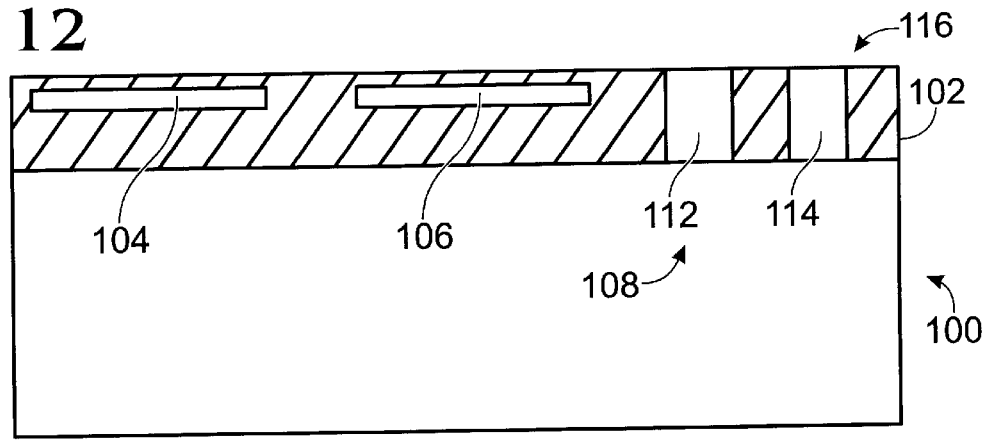

As shown in FIG. 12, a layer of silicon is formed, by selective epitaxial growth, to fill base region 112 and collector link region 114. The surface of the silicon is preferred to be even with the top of the oxide layer, however, a slight variation is not detrimental to the performance of the device.

Figure 13:
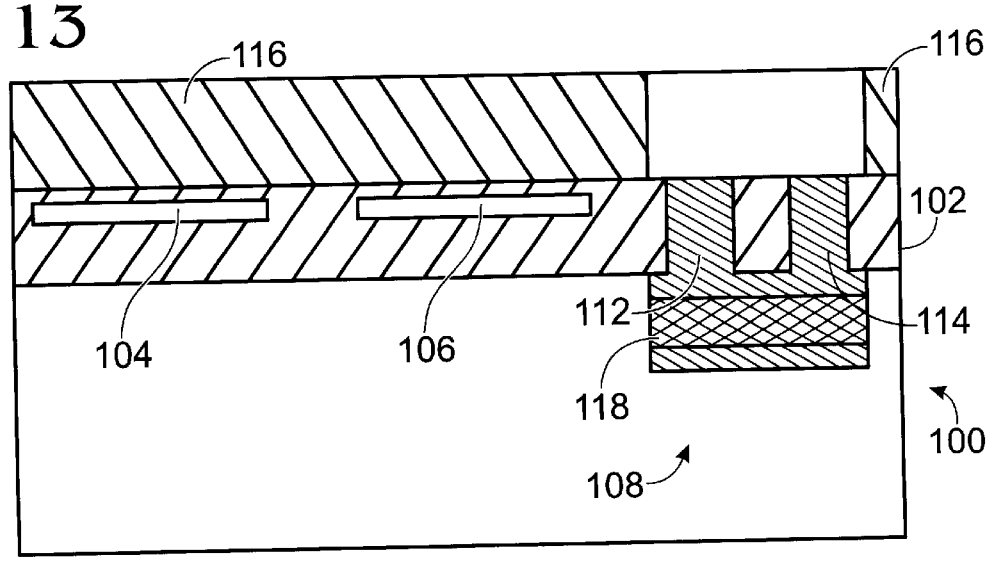

In FIG. 13, the deposition of a photoresist layer, followed by phosphorus ion implantation, is depicted. A deep 400 Kev to 600 Kev phosphorous or 1000 Kev to 1200 Kev arsenic ion implantation results in N+ buried collector 118 and a shallow phosphorous implantation results in doped collector areas 112 and 114. The doping density of the buried collector is in the order of $1 \cdot 10^{19}$ cm$^{-3}$ to $1 \cdot 10^{20}$ cm$^{-3}$. The doping density of n-region is in the order of $1 \cdot 10^{16}$ cm$^{-3}$. The photoresist is then strippoed.

Figure 14:
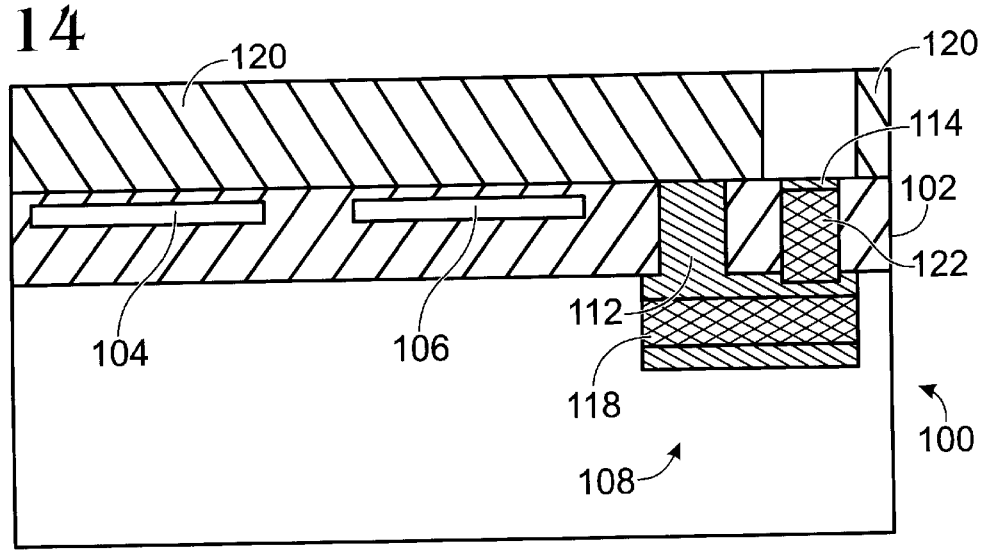

FIG. 14 depicts the formation of a photoresist layer 120 prior to phosphorus ion implantation to N+ dope collector link area 122. The doping density is in the order of $1 \cdot 10^{19}$ cm$^{-3}$ to $1 \cdot 10^{20}$ cm$^{-3}$. Photoresist 120 is then removed.

Figure 15:
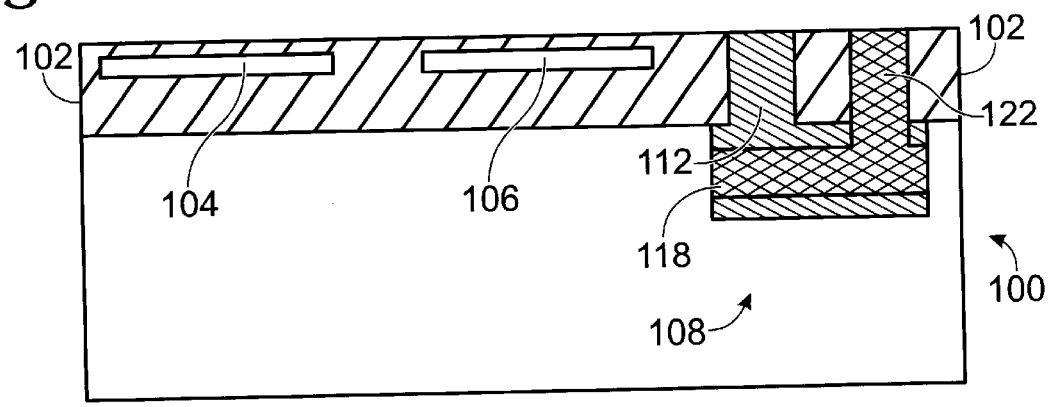

Diffusion, to redistribute phosphorus ions such that the doping density in the collector neutral region is about constant is the next step, and illustrated in FIG. 15. Diffusion can be done at between about 850° C. to 1000° C. for about 30 minutes to 60 minutes.

Figure 16:
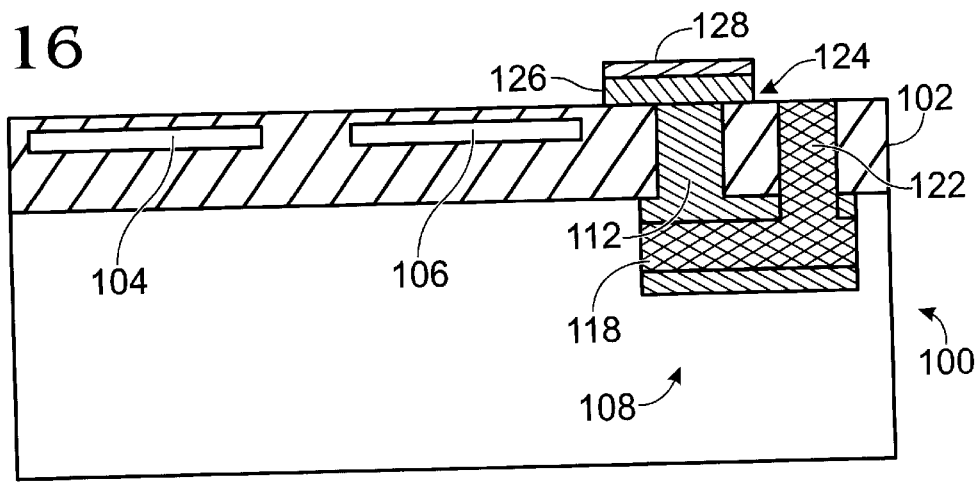

Referring to FIG. 16, epitaxial growth of SiGe 124, a silicon cap 126, and a cap oxide layer 128 is performed. The thickness of SiGe is between about 40 nm to 100 nm, while the thickness of the silicon cap is about 10 nm. The thickness of the cap oxide layer is between about 20 nm to 50 nm. Another photoresist layer (not shown) is deposited prior to etching of cap oxide layer 128, silicon cap 126 and SiGe 124. The photoresist is stripped after etching.

Figure 17:
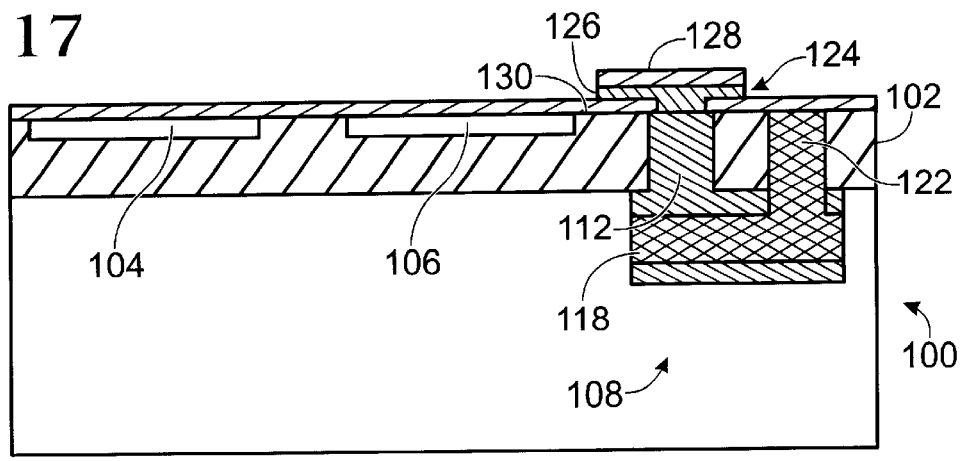

Optionally, and now referring to FIG. 17, a thin layer of oxide 130 may be deposited and etched away at the base region, which area is smaller than the collector opening, prior to the epitaxial growth of FIG. 16. This option is to avoid the facet of the silicon epitaxial layer at the oxide interface.

Figure 18:
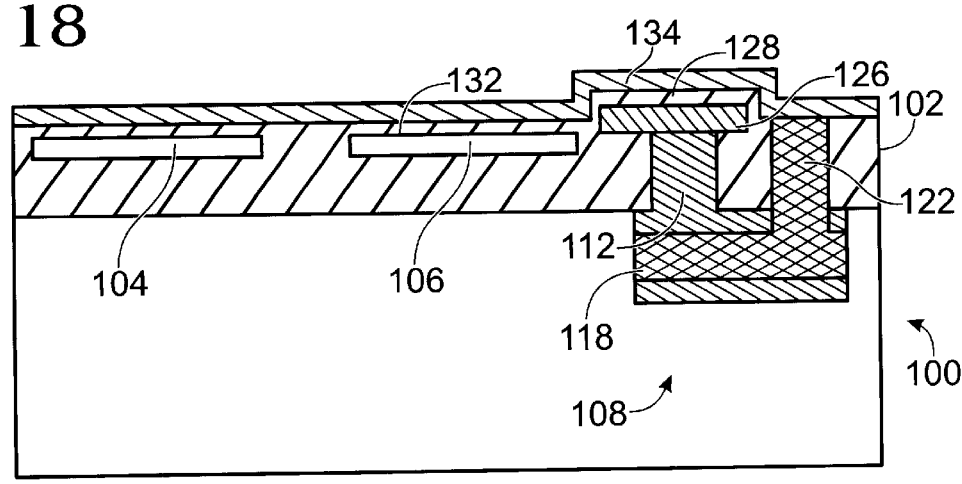

Referring now to FIG. 18, the oxide is etched from the silicon islands on the CMOS region. A gate oxide layer 132 is grown and a first polysilicon layer 134 is deposited.

The thickness of the first polysilicon layer is between about 30 nm to 100 nm.

Figure 19:
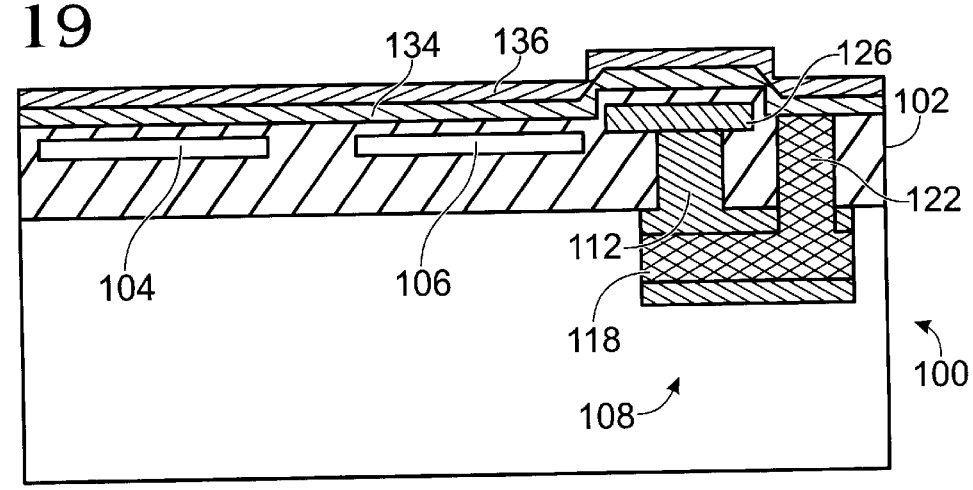

Referring now to FIG. 19, a photoresist layer is deposited prior to etching of first polysilicon layer 134 and of the oxide for emitter-to-base contact. The photoresist is stripped. A second polysilicon layer 136 is deposited, having a thickness of between about 100 nm to 300 nm.

Photoresist (not shown) is again applied prior to phosphorus ion implantation in the polysilicon layer 138 in nMOST active region 104 and emitter area 140, as shown in FIG. 20.

The photoresist is then removed.

Referring now to FIG. 21, photoresist is applied prior to etching of polysilicon to form gate electrodes 142, 144 for the CMOS and an emitter 146 for the SiGe HBT. LDD ion implantation to nMOST forms source 104a, gate 104b and drain 104c, while LDD implantation to pMQST forms drain 106a, gate 106b and source 106c. Sidewall oxides 148, 150 and 151, or nitride formation, are formed about gate electrodes 142, 144 and emitter 146, respectively, followed by n+ and p+ ion implantation. The n+ is implanted to nMOSTs source/drain region and collector contact 122 for the SiGe HBT. The p+ is implanted to the source/drain region of the pMOSTs and the extrinsic base region 152 of the HBT. A silicide layer 154 is deposited and formed between the active regions and the metal electrodes for the active regions.

FIG. 22 depicts the final structure 156 of the second embodiment of the invention following CVD oxide and metallization, which includes a nMOST 158 and a pMOST 160, and a SiGe HBT 162.

Thus, a method for fabricating a high performance SiGe heterojunction bipolar transistor BiCMOS on a silicon-on-insulator substrate has been disclosed. It will be appreciated that further variations and modifications thereof may be made within the scope of the invention as defined in the appended claims.

We claim:

1. A semiconductor structure comprising:
   a SOI substrate;
   a CMOS formed on the substrate and isolated from other structures formed on the substrate; and
   a SiGe HBT formed on the substrate, substantially isolated from other structures formed on the substrate which includes a collector buried in the SOI substrate below the depth of the insulating layer thereof, wherein said SiGe HBT includes a germanium-doped silicon layer having a bas-collector interface and a base-emitter interface, and wherein a germanium concentration decreases monotonically from a range of between about 15% to 20% at the base-collector interface to a concentration of less than about 5% at the base emitter interface.

2. The semiconductor structure of claim 1 wherein said emitter and a collector, and wherein said collector is linked to a collector contact in the SOI substrate.

3. The semiconductor structure of claim 1 which includes a deep trench about an SiGe HBT active region.

4. A method of fabricating a semiconductor structure comprising:
   preparing a SOI substrate;
   forming a CMOS on said substrate; and
   forming a SiGe HBT on said substrate, including fabricating a collector and a collector contact, wherein the collector contact is buried in the SOI substrate below the depth of the insulating layer thereof, which includes providing a germanium-doped silicon layer having a base-collector interface and a base-emitter interface, and wherein a germanium concentration decreases monotonically from a range of between about 15% to 20% at the base-collector interface to a concentration of less than about 5% at the base emitter interface.

5. A method of fabricating a semiconductor structure comprising:
   preparing a SOI substrate having plural active regions therein and a top silicon layer thereon;
   forming a CMOS on said substrate in a first active region;
   isolating the CNMOS Tom other structures on the substrate with oxide to reduce parasitic capacitance; and
   forming a SiGe HBT on said substrate in another active region, including fabricating a collector and a collector contact, wherein the collector contact is buried in the SOI substrate below the depth of the insulating layer thereof, and wherein the remainder of the SiGe HBT is isolated from other structures on the substrate by oxide, and which includes providing a germanium-doped silicon layer having a base-collector interface and a base-emitter interface, and wherein a germanium concentration decreases monotonically from a range of between about 15% to 20% at the base-collector interface to a concentration of less than about 5% at the base emitter interface.

6. The method of claim 5 wherein said isolating includes forming a deep trench about the SiGe HBT active region.

7. The method of claim 5 which further includes thinning the top silicon layer of the SOI substrate by thermal oxidation to a thickness of between about 10 nm and 200 nm.

8. The method of claim 7 which includes replacing the top silicon layer over a portion of the substrate with a layer of oxide.

9. The method of claim 5 wherein said fabricating further includes implanting ions to from an n+ buried collector.

10. The semiconductor structure of claim 1 wherein said SiGe HBT includes a single-crystal silicon epitaxial layer formed in situ on the silicon of the SOI substrate as a collector contact area and a substrate contact area.

11. The method of claim 4 wherein said forming a SiGe HBT includes forming a single-crystal silicon epitaph layer on the silicon of the SOI substrate in situ to form a collector contact area and a substrate contact area.

12. The method of claim 5 wherein said forming a SiGe HBT includes forming a single-crystal silicon epitaxial layer on the silicon of the SOI substrate in situ to form a collector contact area and a substrate contact area.

* * * * *